(12) United States Patent
Kim et al.

(10) Patent No.: US 8,691,616 B2
(45) Date of Patent: Apr. 8, 2014

(54) METHOD FOR MANUFACTURING THIN FILM SOLAR CELL

(71) Applicant: LG Electronics Inc., Seoul (KR)

(72) Inventors: Soohyun Kim, Seoul (KR); Hyun Lee, Seoul (KR); Jinwon Chung, Seoul (KR); Sehwon Ahn, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/671,289

(22) Filed: Nov. 7, 2012

(65) Prior Publication Data

US 2013/0252371 A1 Sep. 26, 2013

(30) Foreign Application Priority Data

Mar. 21, 2012 (KR) .................. 10-2012-0028633

(51) Int. Cl.
*H01L 21/00* (2006.01)
*H01L 21/44* (2006.01)

(52) U.S. Cl.
USPC .......................................... 438/71; 438/665

(58) Field of Classification Search
None
See application file for complete search history.

(56) References Cited

U.S. PATENT DOCUMENTS 6,500,690 B1 * 12/2002 Yamagishi et al. .......... 438/57
6,825,408 B2 * 11/2004 Nagano et al. ............... 136/246
2009/0194157 A1 8/2009 den Boer et al.

OTHER PUBLICATIONS

Kang et al., "Highly Transparent and High Haze ZnO:Al film for Front TCO of a-Si:H and μc-Si:H Solar Cells by Controlling Oxygen Flow", Mater.Res.Soc.Symp.Proc. vol. 1153, Apr. 14, 2009, Material Research Society, 1153-A07-19, XP-002631734, pp. 1-6.
Kluth et al., "Modified Thornton model for magnetron sputtered zinc oxide: film structure and etching behaviour", Thin Solid Films, vol. 442, Oct. 1, 2003, pp. 80-85.
Müller et al., "Upscaling of texture-etched zinc oxide substrates for silicon thin film solar cells", Thin Solid Films, vol. 392, Jul. 30, 2001, pp. 327-333.
Sittinger et al., "ZnO:Al films deposited by in-line reactive AC magnetron sputtering for a-Si:H thin film solar cells", Thin Solid Films, vol. 496, No. 1, Feb. 1, 2006, pp. 16-25.
Yoo et al., "High transmittance and low resistive ZnO:Al films for thin film solar cells", Thin Solid Films, vol. 480-481, Jun. 1, 2005, pp. 213-217.
Zhu et al., "Influence of working pressure on ZnO:Al films from tube targets for silicon thin film solar cells", Thin Solid Films, vol. 518, No. 17, Jun. 30, 2010. pp. 4997-5002.

\* cited by examiner

*Primary Examiner* — Scott B Geyer
(74) *Attorney, Agent, or Firm* — Birch, Stewart, Kolasch & Birch, LLP

(57) ABSTRACT

A method for manufacturing a thin film solar cell includes depositing a front electrode on a substrate in a chamber, etching the front electrode formed on the substrate to form an uneven portion on the surface of the front electrode, forming a photoelectric conversion unit on the front electrode, and forming a back electrode on the photoelectric conversion unit. The depositing of the front electrode includes depositing the front electrode while reducing a process pressure of the chamber from a first pressure to a second pressure lower than the first pressure. The etching of the front electrode form the uneven portion of the front electrode so that a top portion of the uneven portion includes a portion formed at the second pressure.

17 Claims, 17 Drawing Sheets

(a)

|  | Efficiency | Voc | Jsc |
|---|---|---|---|
| Embodiment of the invention | 15.15% | 2.15V | 9.64mA/cm² |
| Comparative example | 15.0% | 2.28V | 8.93mA/cm² |

(b)

METHOD FOR MANUFACTURING THIN FILM SOLAR CELL

This application claims priority to and the benefit of Korean Patent Application No. 10-2012-0028633 filed in the Korean Intellectual Property Office on Mar. 21, 2012, the entire contents of which are incorporated herein by reference.

BACKGROUND OF THE INVENTION

1. Field of the Invention

Embodiments of the invention relate to a method for manufacturing a thin film solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type, and thus, form a p-n junction, and electrodes respectively connected to the semiconductor parts of the different conductive types.

When light is incident on the solar cell, a plurality of electron-hole pairs are produced in the semiconductor parts. The electron-hole pairs are separated into electrons and holes by the photovoltaic effect. The separated electrons move to the n-type semiconductor part, and the separated holes move to the p-type semiconductor part. Then, the electrons and the holes are collected by the electrodes electrically connected to the n-type semiconductor part and the p-type semiconductor part, respectively. The electrodes are connected to each other using electric wires to thereby obtain electric power.

SUMMARY OF THE INVENTION

Embodiments of the invention provide a method for manufacturing a thin film solar cell with improved efficiency.

In one aspect, there is a method for manufacturing a thin film solar cell including depositing a front electrode on a substrate in a chamber, etching the front electrode formed on the substrate to form an uneven portion on the surface of the front electrode, forming a photoelectric conversion unit on the front electrode, and forming a back electrode on the photoelectric conversion unit, wherein the depositing of the front electrode includes depositing the front electrode while reducing a process pressure of the chamber from a first pressure to a second pressure lower than the first pressure, and wherein the etching of the front electrode forms the uneven portion of the front electrode so that a top portion of the uneven portion includes a portion formed at the second pressure.

The depositing of the front electrode may include depositing a first front electrode layer on the substrate at the first pressure and depositing a second front electrode layer on the first front electrode layer at the second pressure.

A deposition thickness of the second front electrode layer may be less than a deposition thickness of the first front electrode layer. For example, the first front electrode layer may be about 1.1 to 2.5 times thicker than the second front electrode layer.

More specifically, a formation thickness of the first front electrode layer may be about 0.5 μm to 1.0 μm. A formation thickness of the second front electrode layer may be about 0.3 μm to 0.6 μm.

Further, the first pressure may be about 1.2 mTorr to 1.4 mTorr, and the second pressure may be about 0.3 mTorr to 1.0 mTorr.

The depositing of the front electrode may include depositing a first front electrode layer on the substrate at the first pressure, and depositing a second front electrode layer on the first front electrode layer while continuously reducing the process pressure of the chamber from the first pressure to the second pressure lower.

The etching of the front electrode forms the uneven portion of the front electrode so that the top portion of the uneven portion may include the second front electrode layer formed at the second pressure, and a valley portion of the uneven portion may include the first front electrode layer formed at the first pressure.

Alternatively, the etching of the front electrode forms the uneven portion of the front electrode so that the top portion of the uneven portion and a valley portion of the uneven portion may include the second front electrode layer formed at the second pressure.

The front electrode may be deposited using a sputtering method. Each of the first front electrode layer and the second front electrode layer of the front electrode may contain aluminum zinc oxide (ZnOx:Al) and may be deposited.

In this instance, an aluminum concentration of the second front electrode layer may be lower than an aluminum concentration of the first front electrode layer. For example, a ratio of an aluminum concentration in a portion of the front electrode contacting the substrate to an aluminum concentration in the top portion of the uneven portion of the front electrode may be about 1.05 to 1.2.

More specifically, an aluminum concentration in a portion of the front electrode contacting the substrate may be about 0.48 wt % to 0.54 wt %. An aluminum concentration in the top portion of the uneven portion of the front electrode may be about 0.42 wt % to 0.48 wt %.

The method for manufacturing the thin film solar cell according to the embodiments of the invention may further improve photoelectric conversion efficiency of the thin film solar cell.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
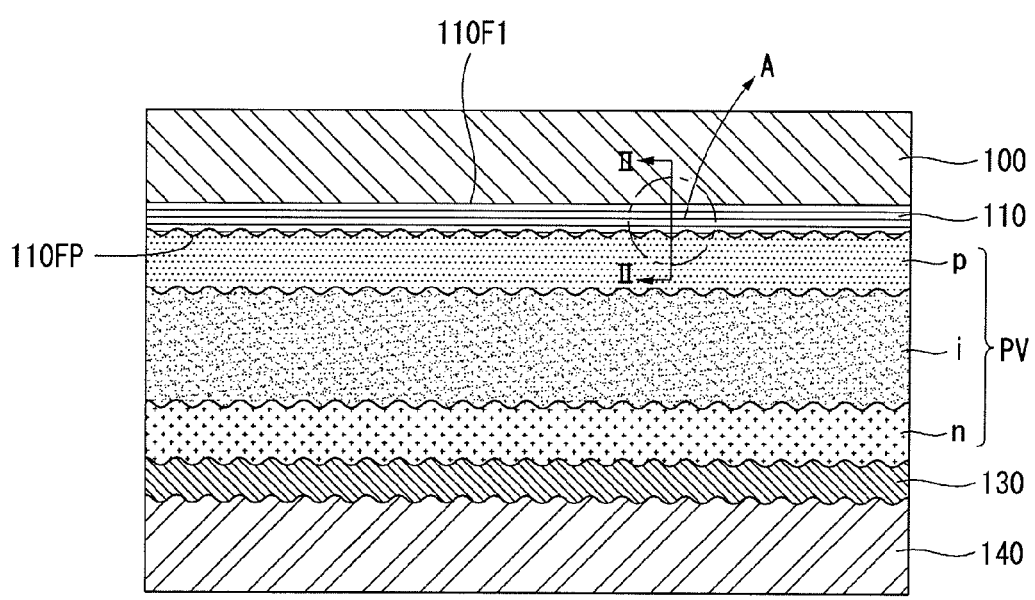
FIG. 1 illustrates a thin film solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. A detailed description of known arts will be omitted if it is determined that the prior arts can lead to obscuring of the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Figure 2:
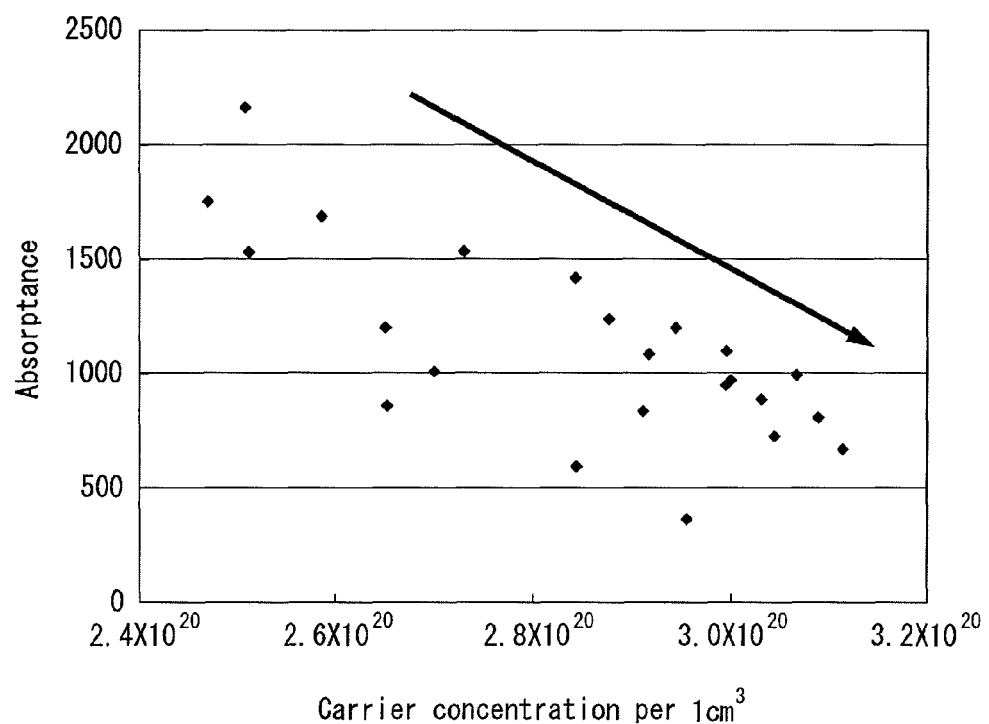
FIGS. 2 to 4 relate to characteristics of a thin film solar cell according to an example embodiment of the invention.
Figure 3:
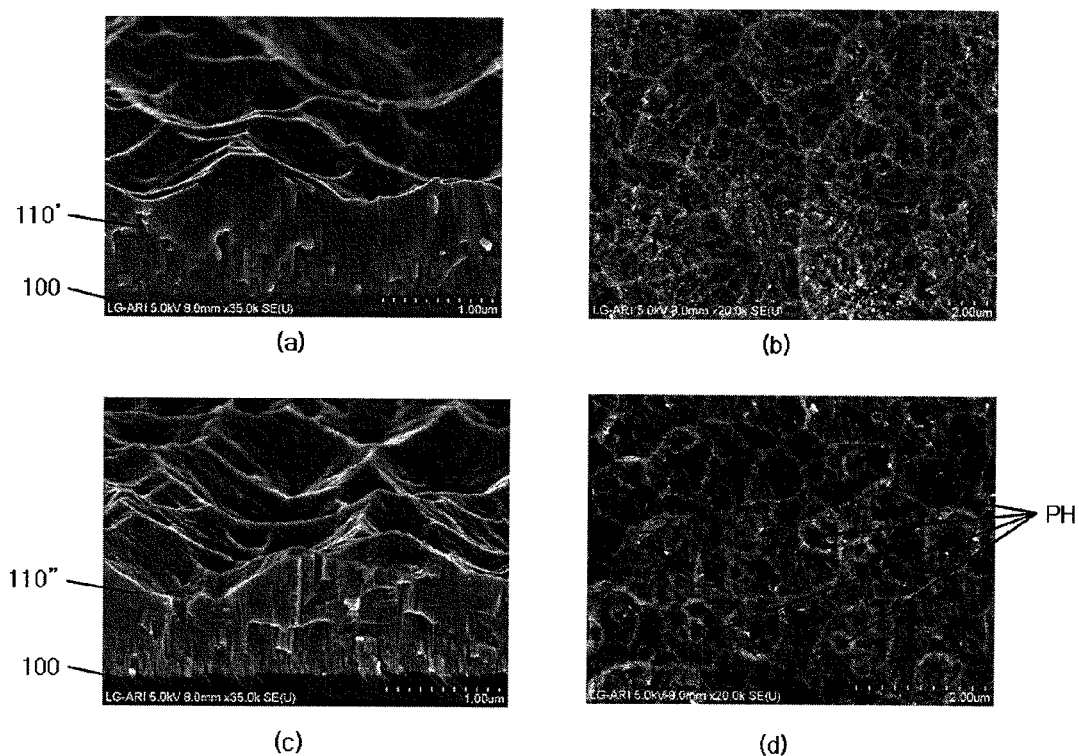
Figure 4:
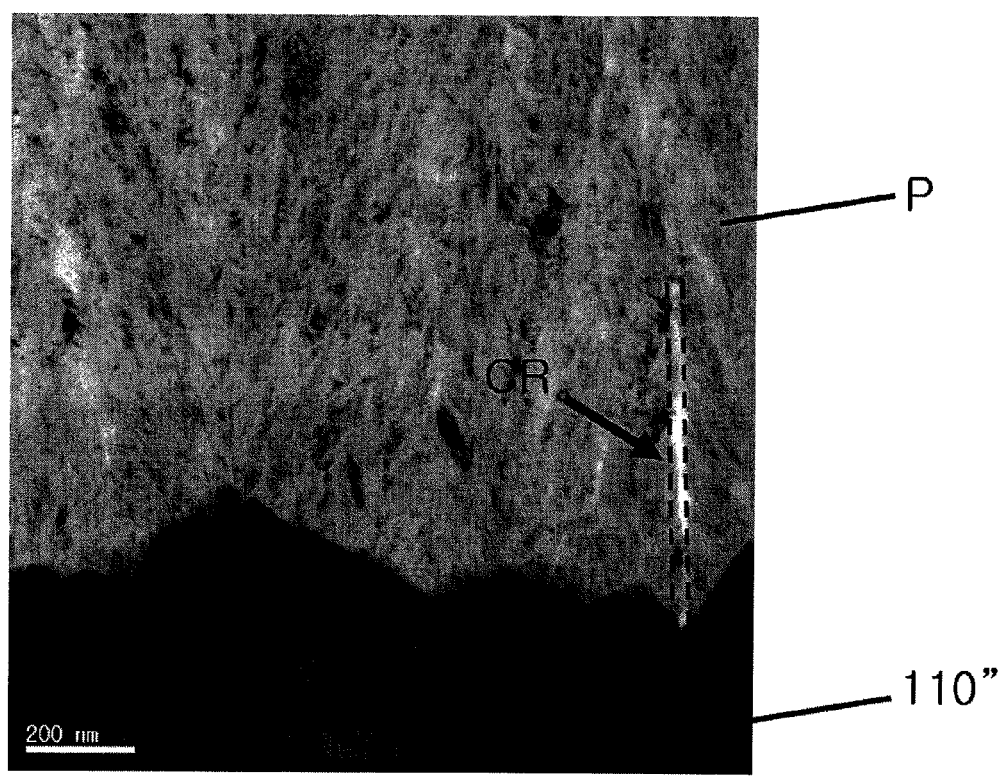

FIG. 1 illustrates a thin film solar cell according to an example embodiment of the invention. FIGS. 2 to 4 illustrate an effect of a thin film solar cell according to an example embodiment of the invention.

As shown in FIG. 1, the thin film solar cell according to the embodiment of the invention includes a substrate 100, a front electrode 110, a photoelectric conversion unit PV, a back reflection layer 130, and a back electrode 140. The back reflection layer 130 may be omitted, if desired.

The substrate 100 serves as a base layer providing a space or a platform for other functional layers to be formed thereon. The substrate 100 may be formed of a substantially transparent non-conductive material, for example, glass or plastic, so that light incident on the substrate 100 efficiently reaches the photoelectric conversion unit PV.

The front electrode 110 is positioned on the substrate 100 and contains a conductive material capable of transmitting light so as to increase a transmittance of incident light. The front electrode 110 may be electrically connected to the photoelectric conversion unit PV. Hence, the front electrode 110 may collect and output carriers (for example, holes) produced by the incident light.

A plurality of uneven portions may be formed on an upper surface of the front electrode 110. Namely, the front electrode 110 may have a textured surface.

As described above, when the surface of the front electrode 110 is textured, the front electrode 110 reduces a reflectance of incident light and increases an amount of light absorbed in the photoelectric conversion unit PV. Hence, the efficiency of the solar cell is improved.

In other words, the textured surface of the front electrode 110 may more efficiently diffuse incident light and may increase a path of the incident light, thereby helping the efficient absorption of light in the photoelectric conversion unit PV.

Further, as shown in FIG. 1, a plurality of uneven portions may be formed on the photoelectric conversion unit PV as well as the upper surface of the front electrode 110. Hence, the photoelectric conversion unit PV may reduce a reflectance of light incident from the outside and may increase an absorptance of light.

The front electrode 110 may contain at least one of aluminum zinc oxide (ZnOx:Al) and boron zinc oxide (ZnOx:B). Other materials may be used.

Figure 6:
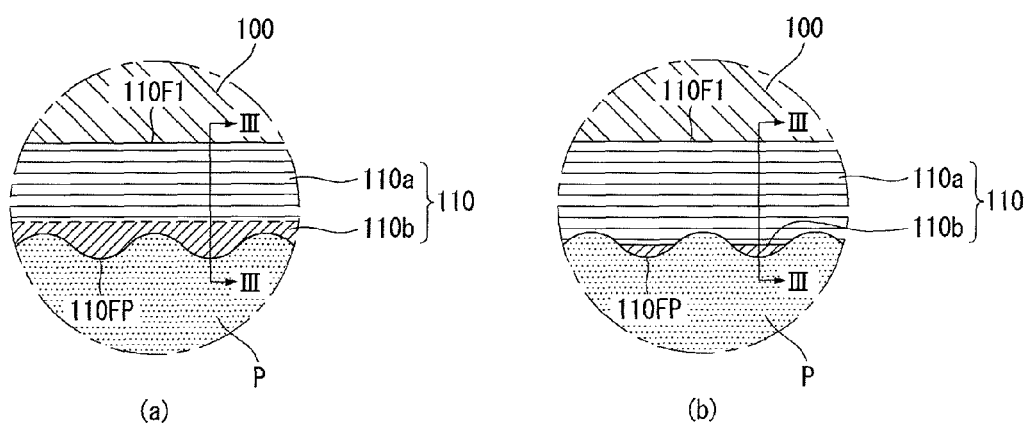
FIG. 6 illustrates other configurations of a front electrode of a thin film solar cell according to an example embodiments of the invention.

FIG. 1 shows the front electrode 110 having a single-layered structure. Alternatively, as shown in FIG. 6, the front electrode 110 may have a two-layered structure. In embodiments of the invention, any number of layers may be used for the front electrode 110.

The front electrode 110 may be deposited using a sputtering method or a chemical vapor deposition (CVD) method.

For example, when the front electrode 110 contains aluminum zinc oxide (ZnOx:Al), the front electrode 110 may be deposited using the sputtering method. When the front electrode 110 contains boron zinc oxide (ZnOx:B), the front electrode 110 may be deposited using the CVD method.

Namely, the front electrode 110 may be deposited on the substrate 100 using the sputtering method, and then a wet etching process may be performed on the front electrode 110 to form the plurality of uneven portions on the surface of the front electrode 110.

The photoelectric conversion unit PV is positioned, between the front electrode 110 and the back reflection layer 130, and converts light incident on an incident surface of the substrate 100 from the outside into electric power.

The photoelectric conversion unit PV may have a p-i-n structure including a p-type semiconductor layer p, an intrinsic (referred to as an i-type) semiconductor layer i, and an n-type semiconductor layer n which are sequentially formed on the incident surface of the substrate 100 in the order named. Other layers may be included or present in the photoelectric conversion unit PV. In another embodiment, the n-type semiconductor layer n, the i-type semiconductor layer i, and the p-type semiconductor layer p may be sequentially formed on the incident surface of the substrate 100 in the order named.

In the following description, the photoelectric conversion unit PV having the p-i-n structure from the incident surface of the substrate 100 is taken as an example for the sake of brevity or example.

The p-type semiconductor layer p may be formed using a gas obtained by adding impurities of a group III element, such as boron (B), gallium (Ga), and indium (In), to a raw gas containing silicon (Si).

The i-type semiconductor layer i may prevent or reduce a recombination of carriers and may absorb light. The i-type semiconductor layer i may absorb incident light to produce carriers such as electrons and holes.

The i-type semiconductor layer i may contain amorphous silicon (a-si), for example, hydrogenated amorphous silicon (a-Si:H). Alternatively, the i-type semiconductor layer i may contain microcrystalline silicon (mc-Si), for example, hydrogenated microcrystalline silicon (mc-Si:H).

Amorphous silicon (a-si) has an advantage in absorbing light of a short wavelength band, and microcrystalline silicon (mc-Si) has an advantage in absorbing light of a long wavelength band.

Thus, when the photoelectric conversion unit PV is plural, amorphous silicon may be used in a photoelectric conversion unit PV close to the incident surface of the substrate 100, and microcrystalline silicon may be used in a photoelectric conversion unit PV away from the incident surface of the substrate 100.

The n-type semiconductor layer n may be formed using a gas obtained by adding impurities of a group V element, such as phosphorus (P), arsenic (As), and antimony (Sb), to a raw gas containing silicon (Si).

The photoelectric conversion unit PV may be formed using a chemical vapor deposition (CVD) method, such as a plasma enhanced CVD (PECVD) method.

As shown in FIG. 1, doped layers, for example, the p-type semiconductor layer p and the n-type semiconductor layer n of the photoelectric conversion unit PV may form a p-n junction with the i-type semiconductor layer i interposed between the doped layers p and n.

The back reflection layer 130 is positioned between the photoelectric conversion unit PV and the back electrode 140 and again reflects light back to the photoelectric conversion unit PV, which had not been absorbed by the photoelectric conversion unit PV.

The back electrode 140 is separated from the front electrode 110 and is positioned on the photoelectric conversion unit PV. The back electrode 140 may be formed of metal with high electrical conductivity so as to increase a recovery efficiency of electric power generated by the photoelectric conversion unit PV.

The back electrode 140 may be electrically connected to the photoelectric conversion unit PV and may collect and output carriers (for example, electrons) produced by incident light.

In such a structure of the thin film solar cell illustrated in FIG. 1, when light is incident on the p-type semiconductor layer p, a depletion region is formed inside the i-type semiconductor layer i because of the p-type semiconductor layer p and the n-type semiconductor layer n each having a relatively high doping concentration, thereby generating an electric field. Electrons and holes, which are produced in a light absorbing layer, i.e., the i-type semiconductor layer i by a photovoltaic effect, are separated from each other by a contact potential difference and move in different directions. For example, the holes may move to the front electrode 110 through the p-type semiconductor layer p, and the electrons may move to the back electrode 140 through the n-type semiconductor layer n. Hence, electric power may be produced when the semiconductor layers p and n are respectively connected using external wires, for example.

In the thin film solar cell according to the embodiment of the invention, a concentration (hereinafter, referred to as 'carrier concentration') of carriers in a top portion 110FP of each of the plurality of uneven portions of the front electrode 110 is lower than a concentration of carriers in a portion 110F1 (i.e., a contact portion 110F1 between the substrate 100 and the front electrode 110) of the front electrode 110 contacting the substrate 100.

In the embodiment of the invention, the carriers indicate holes or residual electrons with the electrical conductivity.

The concentration of the carriers may be adjusted by adjusting a concentration of one of materials constituting the front electrode 110.

Namely, when the front electrode 110 is formed of aluminum zinc oxide (ZnOx:Al), residual electrons are produced in a process for depositing aluminum (Al) on zinc oxide (ZnOx). Therefore, a parameter for determining the concentration of the carriers is a concentration of aluminum (Al).

Accordingly, when the front electrode 110 is formed of aluminum zinc oxide (ZnOx:Al), the concentration of the carriers may increase as the concentration of aluminum (Al) increases, and vice versa.

Further, when the front electrode 110 is formed of boron zinc oxide (ZnOx:B), residual electrons are produced in a process for, depositing boron (B) on zinc oxide (ZnOx). Therefore, a parameter for determining the concentration of the carriers is a concentration of boron (B).

Accordingly, when the front electrode 110 is formed of boron zinc oxide (ZnOx:B), the concentration of the carriers may increase as the concentration of boron (B) increases, and vice versa.

As described above, because the carrier concentration in the contact portion 110F1 of the front electrode 110 is higher than the carrier concentration in the top portion 110FP of the front electrode 110, a reduction in the light transmittance may be prevented or minimized. Further, the generation of a crack in the photoelectric conversion unit PV formed on the front electrode 110 may be prevented or minimized while minimizing the formation of pinholes in the front electrode 110.

A relationship between the carrier concentration and a light absorptance, a relationship between the carrier concentration and the pinhole, and a relationship between the carrier concentration and the crack in the front electrode 110 are described in detail below.

First, the relationship between the carrier concentration and the light absorptance in the front electrode 110 is described with reference to FIG. 2.

In FIG. 2, X-axis indicates a concentration of carriers per unit volume ($cm^3$), and Y-axis indicates the light absorptance.

As shown in FIG. 2, because the light absorptance increases as the carrier concentration decreases, the light transmittance may be reduced. Further, because the light absorptance decreases as the carrier concentration increases, the light transmittance may increase. As described above, the carrier concentration of the front electrode 110 is inversely proportional to the light absorptance.

The inversely proportional relationship between the carrier concentration of the front electrode 110 and the light absorptance is that the light absorptance decreases because a band gap increases due to an increase in the carrier concentration.

According to the above-described characteristics of the front electrode 110, as a low carrier concentration portion of the front electrode 110 increases, the light transmittance of the front electrode 110 decreases.

Next, the relationship between the carrier concentration and the pinhole in the front electrode is described with reference to FIG. 3.

FIG. 3 is an example of taking the front electrode 110, provided with the uneven portions through the etching process, using an optical microscope.

In FIG. 3, (a) and (b) are a side photograph and a plane photograph (as viewed from above) taken when a concentration of aluminum (Al) of a front electrode 110' is relatively low, respectively.

Further, in FIG. 3, (c) and (d) are a side photograph and a plane photograph (as viewed from above) taken when a concentration of aluminum (Al) of a front electrode 110" is relatively high, respectively.

As shown in (b) of FIG. 3, when the concentration of aluminum (Al) of the front electrode 110' was relatively low, compactness of the front electrode 110' was relatively high. Hence, when uneven portions of the front electrode 110' were formed through the etching process, roughness of the uneven portions was softened as shown in (a) of FIG. 3. Further, the pinhole was hardly formed.

However, as shown in (d) of FIG. 3, when the concentration of aluminum (Al) of the front electrode 110" was relatively high, compactness of the front electrode 110" was relatively low. Hence, when uneven portions of the front electrode 110" were formed through the etching process, a plurality of pinholes PH were formed on the surface of the front electrode 110" as shown in (d) of FIG. 3.

As described above, a reason why the pinhole is hardly formed when the compactness of the front electrode 110' is high, is that a low density area of the front electrode 110' is small. Namely, even if the etching process is performed, the front electrode 110' is uniformly etched.

However, when the compactness of the front electrode 110" is low, a low density area of the front electrode 110" increases. Hence, when the etching process is performed, the low density area of the front electrode 110" is excessively etched, and thus, the pinholes are formed.

Further, the compactness of the front electrode is a variable determining the roughness of the uneven portions of the front electrode. Namely, as shown in (a) and (b) of FIG. 3, when a density of the front electrode 110' increases due to an increase in the compactness of the front electrode 110', the roughness of the uneven portions of the front electrode 110' is further softened even if the front electrode 110' is etched. On the other hand, as shown in (c) and (d) of FIG. 3, when a density of the front electrode 110" decreases due to a reduction in the compactness of the front electrode 110", the roughness of the uneven portions of the front electrode 110" increases when the front electrode 110" is etched.

Accordingly, as the compactness of the front electrode increases, the roughness of the front electrode decreases. Further, as the compactness of the front electrode decreases, the roughness of the front electrode increases. Namely, the compactness and the roughness of the front electrode have an inversely proportional relationship.

Because the compactness of the front electrode relatively decreases as the carrier concentration of the front electrode increases, the number of pinholes serving as a defect relatively increases. Further, because the compactness of the front electrode relatively increases as the carrier concentration of the front electrode decreases, the number of pinholes serving as a defect relatively decreases.

Next, the relationship between the carrier concentration and the crack in the front electrode is described with reference to FIG. 4.

FIG. 4 depicts a portion of the photoelectric conversion unit PV formed on the front electrode 110" when the carrier concentration of the front electrode 110" is relatively high in the same manner as (c) of FIG. 3.

As shown in FIG. 4, when the carrier concentration of the front electrode 110" was relatively high, roughness of the front electrode 110" relatively increased. Hence, a slope angle of the uneven portion of the front electrode 110" relatively increased, and a crack CR serving as a defect in a portion of the photoelectric conversion unit PV may be generated.

However, when the carrier concentration of the front electrode 110' was relatively low as shown in (a) and (b) of FIG. 3, the roughness of the uneven portions may be softened. Hence, a slope angle of the uneven portion of the front electrode 110' was gentler, and the top portion 110FP or a valley portion of each uneven portion may include a curved surface.

In this instance, as shown in FIG. 4, when the photoelectric conversion unit PV is deposited on the front electrode 110", the generation of the crack serving as a defect in a portion of the photoelectric conversion unit PV may be minimized.

As described above, the embodiment of the invention does not reduce the entire carrier concentration of the front electrode 110 and partially adjusts the carrier concentration of the front electrode 110, in consideration of the relationship between the carrier concentration and the light absorptance, the relationship between the carrier concentration and the pinhole, and the relationship between the carrier concentration and the crack in the front electrode 110. Namely, the embodiment of the invention controls so that the carrier concentration in the top portion 110FP of each uneven portion of the front electrode 110 is lower than the carrier concentration in the contact portion 110F1 between the substrate 100 and the front electrode 110. Hence, a reduction in the entire transmittance of the front electrode 110 may be minimized, and the formation of the pinholes of the front electrode 110 may be minimized. Further, the generation of the crack in the photoelectric conversion unit PV formed on the front electrode 110 may be minimized.

More specifically, when the entire carrier concentration of the front electrode 110 is reduced, the entire transmittance of the front electrode 110 is excessively reduced. Thus, the partial adjustment according to the embodiment of the invention prevents or reduces the problem. Further, the pinholes formed in the front electrode 110 and the crack generated in the photoelectric conversion unit PV are greatly affected by the roughness of the uneven portions (contacting the photoelectric conversion unit PV) of the front electrode 110, i.e., the slope angle of the uneven portion or the compactness of the front electrode 110 in the formation portion of the uneven portions. Thus, the embodiment of the invention partially adjusts the carrier concentration of the front electrode 110.

A method for adjusting the carrier concentration of the front electrode 110 was briefly described above.

When the front electrode 110 is formed of aluminum zinc oxide (ZnOx:Al), a concentration of aluminum (Al) in the top portion 110FP of each uneven portion of the front electrode 110 is lower than a concentration of aluminum (Al) in the contact portion 110F1 between the substrate 100 and the front electrode 110. Hence, the carrier concentration of the top portion 110FP may be lower than the carrier concentration of the contact portion 110F1.

Further, when the front electrode 110 is formed of boron zinc oxide (ZnOx:B), a concentration of boron (B) in the top portion 110FP of each uneven portion of the front electrode 110 is lower than a concentration of boron (B) in the contact portion 110F1 between the substrate 100 and the front electrode 110. Hence, the carrier concentration of the top portion 110FP may be lower than the carrier concentration of the contact portion 110F 1.

FIGS. 5 to 8 illustrate various examples of adjusting the carrier concentration of the front electrode 110.

Figure 5:
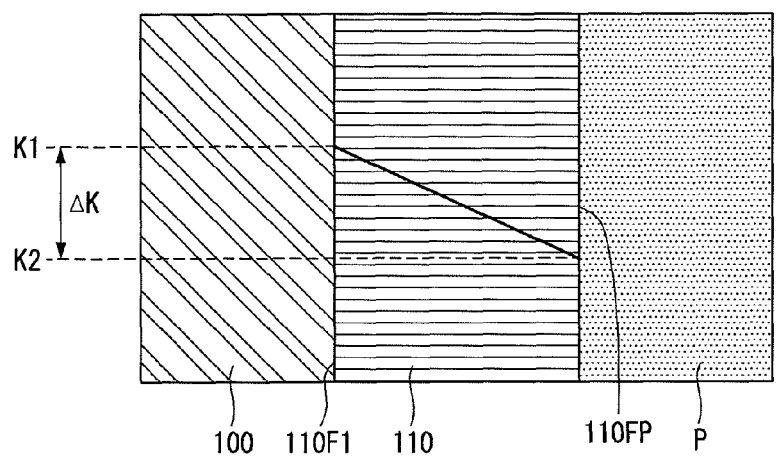
FIG. 5 illustrates a first example of a carrier concentration in a cross-section taken along line II-II including a top portion of an uneven portion in a portion 'A' of FIG. 1.

FIG. 5 illustrates a first example of the carrier concentration in a cross-section taken along line II-II including the top portion of the uneven portion in a portion 'A' of FIG. 1.

As shown in FIG. 5, the carrier concentration of the front electrode 110 may gradually decrease as it goes from the contact portion 110F1 to the top portion 110FP.

As described above, the carrier concentration of the front electrode 110 may be adjusted by gradually reducing a concentration of aluminum (Al) constituting the front electrode 110 when the front electrode 110 is formed of aluminum zinc oxide (ZnOx:Al) as it goes from the contact portion 110F1 to the top portion 110FP. Further, the carrier concentration of the front electrode 110 may be adjusted by gradually reducing a concentration of boron (B) constituting the front electrode 110 when the front electrode 110 is formed of boron zinc oxide (ZnOx:B) as it goes from the contact portion 110F1 to the top portion 110FP.

In the embodiment of the invention, a ratio K1/K2 of a first carrier concentration K1 in the contact portion 110F1 to a second carrier concentration K2 in the top portion 110FP may be (or determined to) about 1.05 to 1.2.

When the ratio K1/K2 of the first carrier concentration K1 to the second carrier concentration K2 is about 1.05 to 1.2, a reduction in the transmittance in the top portion 110FP of the front electrode 110 may be prevented or reduced. Further, the proper roughness and the proper compactness of the uneven portions of the front electrode 110 may be secured, and thus, the pinholes in the front electrode 110 and the crack in the photoelectric conversion unit PV formed on the front electrode 110 may be prevented or reduced from being generated. As a result, the photoelectric conversion efficiency of the solar cell may be improved.

The first carrier concentration K1 may be (or determined to) about $2.65 \times 10^{20}$ to $2.75 \times 10^{20}$ per unit volume (cm$^3$), and the second carrier concentration K2 may be (or determined to) about $2.45 \times 10^{20}$ to $2.6 \times 10^{20}$ per unit volume (cm$^3$).

To form the above-described carrier concentration of the front electrode 110, for example, when the front electrode 110 is formed of, aluminum zinc oxide (ZnOx:Al), a ratio A1/A2 of a first aluminum concentration A1 in the contact portion 110F1 to a second aluminum concentration A2 in the top portion 110FP may be (or determined to) about 1.05 to 1.2. In the ratio A1/A2, the first aluminum concentration A1 may be (or determined to) about 0.48 wt % to 0.54 wt %, and the second aluminum concentration A2 may be (or determined to) about 0.42 wt % to 0.48 wt %.

Further, when the front electrode 110 is formed of boron zinc oxide (ZnOx:B), the carrier concentration of the front electrode 110 may be adjusted by adjusting a concentration of boron (B) in the same manner as aluminum.

FIG. 6 illustrates another configuration of the front electrode of the thin film solar cell according to the embodiment of the invention.

As shown in FIG. 6, the front electrode 110 according to the embodiment of the invention may have a two-layered structure.

More specifically, the front electrode 110 according to the embodiment of the invention may include a first front electrode layer 110a and a second front electrode layer 110b. The first front electrode layer 110a may contact the substrate 100, and the second front electrode layer 110b may include the top portion 110FP of the uneven portion.

A thickness of the first front electrode layer 110a may be greater than a thickness of the second front electrode layer 110b.

The first front electrode layer 110a and the second front electrode layer 110b may be distinguished from each other by the carrier concentration. More specifically, a carrier concentration of the second front electrode layer 110b may be lower than a carrier concentration of the first front electrode layer 110a.

Further, each of the first and second front electrode layers 110a and 110b may be formed of aluminum zinc oxide (ZnOx:Al) or boron zinc oxide (ZnOx:B). Alternatively, the first front electrode layer 110a may be formed of aluminum zinc oxide (ZnOx:Al), and the second front electrode layer 110b may be formed of boron zinc oxide (ZnOx:B).

In the following description, the case where each of the first and second front electrode layers 110a and 110b is formed of aluminum zinc oxide (ZnOx:Al) will be taken as an example for the sake of brevity.

As shown in FIG. 6, the second front electrode layer 110b may be formed in the top portions 110FP of the front electrode 110.

For example, as shown in (a) of FIG. 6, the uneven portions of the front electrode 110 may be formed only in the second front electrode layer 110b and may not be formed in the first front electrode layer 110a. Alternatively, as shown in (b) of FIG. 6, both the first and second front electrode layers 110a and 110b may form the uneven portions of the front electrode 110. In this instance, the top portions 110FP of the uneven portions may be formed only in the second front electrode layer 110b.

Accordingly, as shown in (a) of FIG. 6, the uneven portions of the front electrode 110 may be formed only in the second front electrode layer 110b. Alternatively, as shown in (b) of FIG. 6, the first front electrode layer 110a may form the valley portion of each uneven portion, and the second front electrode layer 110b may form the top portion 110FP of each uneven portion.

Various examples of the carrier concentration in a cross-section taken along line III-III shown in (a) or (b) of FIG. 6 are described in detail below.

Figure 7:
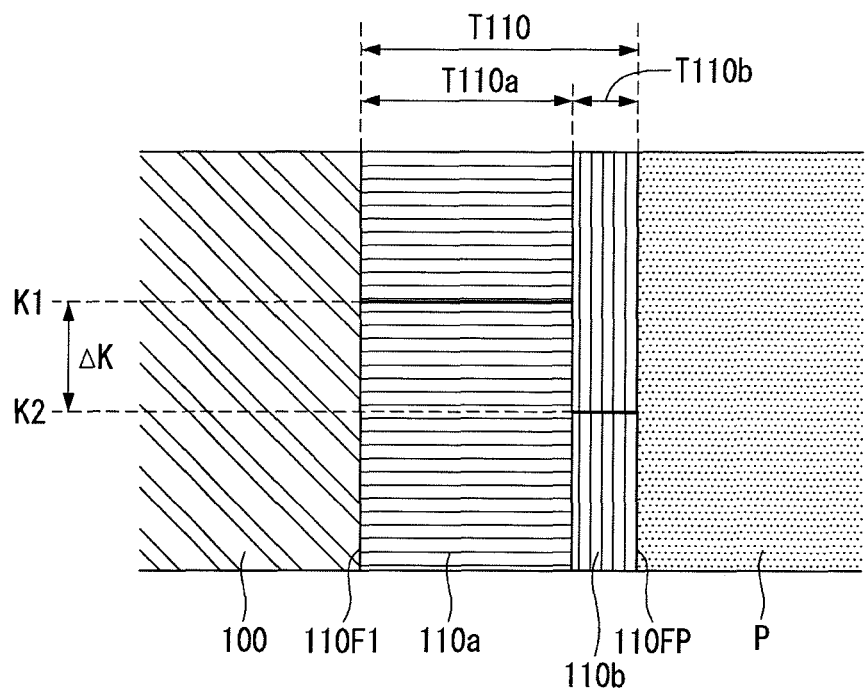
FIG. 7 illustrates a second example of a carrier concentration in a cross-section taken along line III-III including a top portion of an uneven portion of a front electrode shown in FIG. 6.

FIG. 7 illustrates a second example of the carrier concentration in a cross-section taken along line III-III including the top portion of the uneven portion of the front electrodes shown in FIG. 6.

As shown in FIG. 7, in the thin film solar cell according to the embodiment of the invention, a carrier concentration in a top portion 110FP of each uneven portion of the front electrode 110 is lower than a carrier concentration in a contact portion 110F1 between the substrate 100 and the front electrode 110. Further, the front electrode 110 includes a first front electrode layer 110a and a second front electrode layer 110b. The first front electrode layer 110a may be uniformly formed with a first carrier concentration K1 having a relatively high value, and the second front electrode layer 110b may be uniformly formed with a second carrier concentration K2 having a relatively low value.

A ratio K1/K2 of the first carrier concentration K1 to the second carrier concentration K2 may be (or determined to) about 1.05 to 1.2 in the same manner as FIG. 5. Further, the first carrier concentration K1 may be (or determined to) about $2.65 \times 10^{20}$ to $2.75 \times 10^{20}$ per unit volume (cm$^3$), and the second carrier concentration K2 may be (or determined to) about $2.45 \times 10^{20}$ to $2.6 \times 10^{20}$ per unit volume (cm$^3$) in the same manner as FIG. 5.

Each of the first and second carrier concentrations K1 and K2 may be adjusted using the same method as FIG. 5.

More specifically, when the front electrode 110 is formed of aluminum zinc oxide (ZnOx:Al), an aluminum concentration of the first front electrode layer 110a may uniformly have a first aluminum concentration A1 of the contact portion 110F1, and an aluminum concentration of the second front electrode layer 110b may uniformly have a second aluminum concentration A2 of the top portion 110FP.

In this instance, a ratio A1/A2 of the first aluminum concentration A1 to the second aluminum concentration A2 may be (or determined to) about 1.05 to 1.2. In the ratio A1/A2, the first aluminum concentration A1 may be (or determined to) about 0.48 wt % to 0.54 wt %, and the second aluminum concentration A2 may be (or determined to) about 0.42 wt % to 0.48 wt %.

Further, a thickness of the first front electrode layer 110a having a relatively high carrier concentration may be greater than a thickness of the second front electrode layer 110b having a relatively low carrier concentration. Hence, the entire carrier concentration of the front electrode 110 including the first and second front electrode layers 110a and 110b may be higher than the entire carrier concentration of the front electrode 110 shown in FIG. 5. As a result, the entire transmittance of the front electrode 110 may be further improved.

Compactness and roughness in the top portions 110FP of the front electrode 110 may be held at the same level as FIG. 5. Hence, the generation of pinholes in the front electrode 110 may be prevented or reduced, and the generation of crack in the photoelectric conversion unit PV formed on the front electrode 110 may be minimized. As a result, the photoelectric conversion efficiency of the solar cell may be improved.

Figure 8:
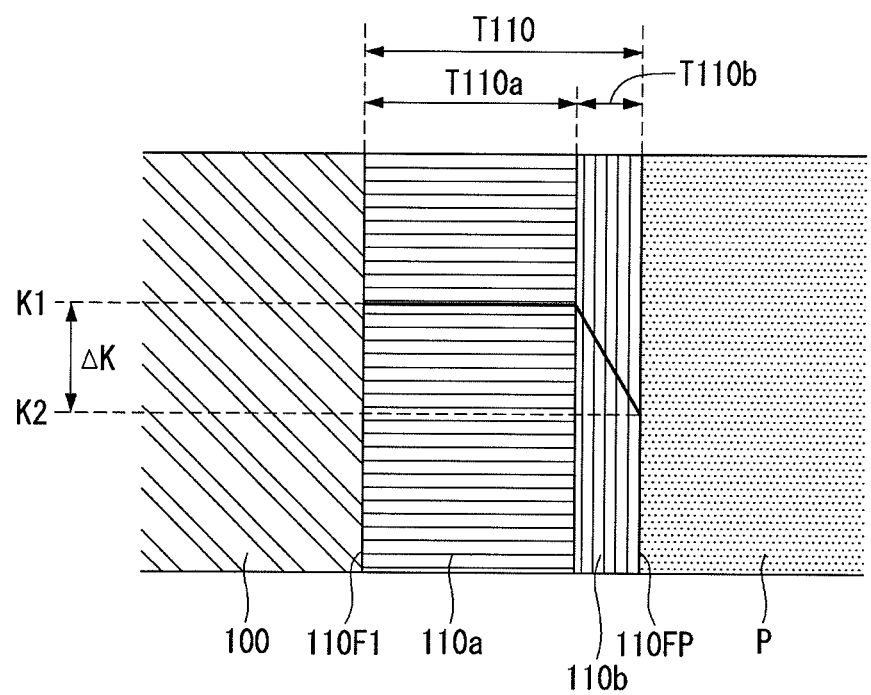
FIG. 8 illustrates a third example of a carrier concentration in a cross-section taken along line III-III including a top portion of an uneven portion of a front electrode shown in FIG. 6.

FIG. 8 illustrates a third example of the carrier concentration in a cross-section taken along line III-III including the top portion of the uneven portion of the front electrode shown in FIG. 6.

A carrier concentration of the first front electrode layer 110a shown in FIG. 8 is substantially the same as the carrier concentration of the first front electrode layer 110a shown in FIG. 7. However, a carrier concentration of the second front electrode layer 110b shown in FIG. 8 is different from the carrier concentration of the second front electrode layer 110b shown in FIG. 7.

Accordingly, only the carrier concentration of the second front electrode layer 110b will be separately described below with reference to FIG. 8, and the description of FIG. 7 may be equally applied to remaining description of FIG. 8. Therefore, a further description may be only briefly made or may be entirely omitted.

As shown in FIG. 8, the carrier concentration of the second front electrode layer 110b may be reduced from a first carrier concentration K1 to a second carrier concentration K2.

For this, when the front electrode 110 is formed of aluminum zinc oxide (ZnOx:Al), aluminum concentration of the second front electrode layer 110b may be reduced from the first carrier concentration K1 to the second carrier concentration K2.

As described above, the entire transmittance of the front electrode 110 may be held in a better state by uniformly holding the carrier concentration of the first front electrode layer 110a to the first carrier concentration K1 and reducing the carrier concentration of the second front electrode layer 110b from the first carrier concentration K1 to the second carrier concentration K2. Further, the proper roughness and the proper compactness of the uneven portions of the front electrode 110 may be secured. Hence, the generation of pinholes in the front electrode 110 may be prevented or reduced, and the generation of crack in the photoelectric conversion unit PV formed on the front electrode 110 may be minimized. As a result, the photoelectric conversion efficiency of the solar cell may be improved.

In embodiments of the invention, the change in the carrier concentration from the first front electrode layer 110a to the second front electrode layer 110b may be discontinuous or abrupt, may be continuous or gradual, or a combination of discontinuous and continuous. Even within each of the first front electrode layer 110a and the second front electrode layer 110b, there may be a respective change in the carrier concentration that may be at least one of discontinuous and continuous, or a combination thereof.

So far, the embodiment of the invention described the single junction solar cell as an example. On the other hand, the embodiment of the invention may be equally applied to a double junction solar cell and a triple junction solar cell.

Figure 9:
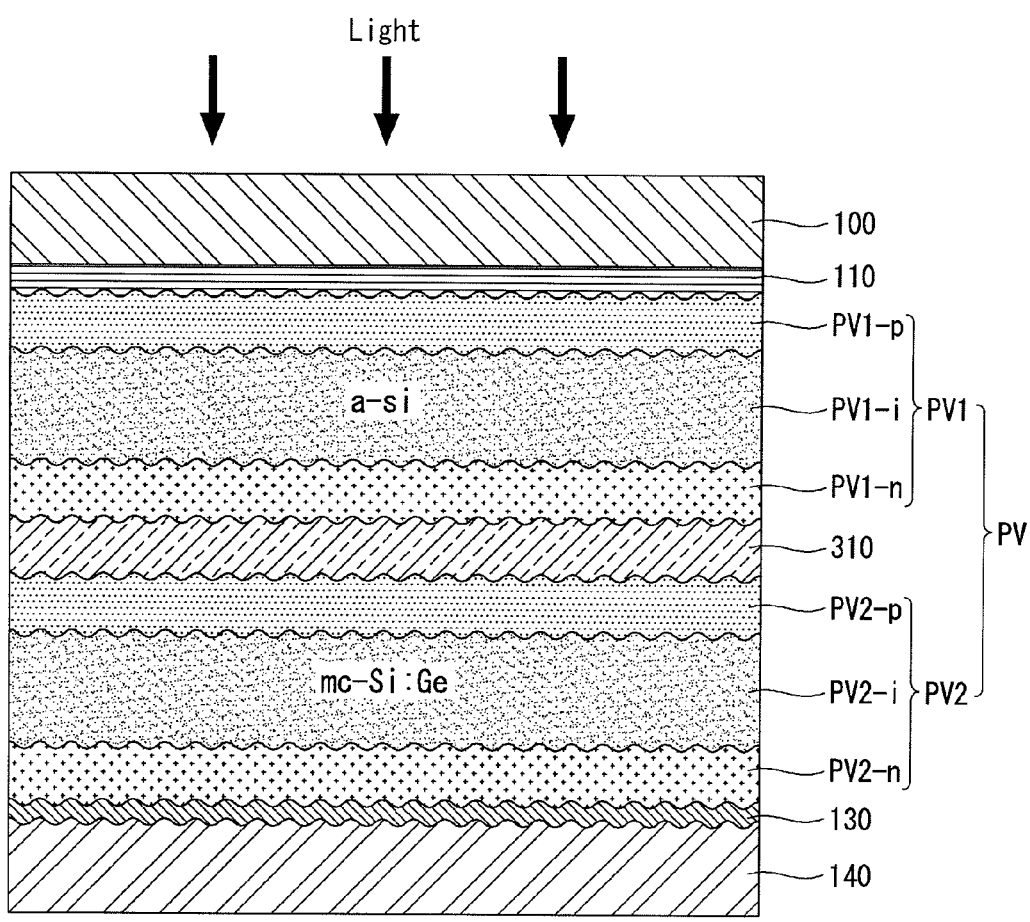
FIG. 9 illustrates an example where a solar cell according to an example embodiment of the invention includes a double junction solar cell having a p-i-n/p-i-n structure.

FIG. 9 illustrates an example where the solar cell according to the embodiment of the invention includes a double junction solar cell having a p-i-n/p-i-n structure.

Structures and components identical or equivalent to those described above are designated with the same reference numerals, and a further description may be only briefly made or may be entirely omitted.

As shown in FIG. 9, a photoelectric conversion unit PV of the double junction solar cell may include a first photoelectric conversion unit PV1 and a second photoelectric conversion unit PV2.

In the double junction solar cell shown in FIG. 9, a first p-type semiconductor layer PV1-p, a first i-type semiconductor layer PV1-i, a first n-type semiconductor layer PV1-n, a second p-type semiconductor layer PV2-p, a second i-type semiconductor layer PV2-i, and a second n-type semiconductor layer PV2-n may be sequentially stacked on the incident surface of the substrate 100 in the order named. Other layers may be included or present in the photoelectric conversion unit PV.

The first i-type semiconductor layer PV 1-i may mainly absorb light of a short wavelength band to produce electrons and holes.

The second i-type semiconductor layer PV2-i may mainly absorb light of a long wavelength band wider than the short wavelength band to produce electrons and holes.

As described above, because the double junction solar cell absorbs light of the short wavelength band and light of the long wavelength band to produce carriers, the efficiency of the solar cell module can be improved.

In the double junction solar cell shown in FIG. 9, the first i-type semiconductor layer PV1-i of the first photoelectric conversion unit PV1 may contain amorphous silicon (a-Si), and the second i-type semiconductor layer PV2-i of the second photoelectric conversion unit PV2 may contain germanium-containing microcrystalline silicon (mc-Si:Ge).

In the double junction solar cell shown in FIG. 9, the carrier concentration in the top portion 110FP of each uneven portion of the front electrode 110 may be lower than the carrier concentration in the contact portion 110F1 between the substrate 100 and the front electrode 110 in the same manner as FIG. 1. All of the configurations illustrated in FIGS. 5 to 8 may be applied to the double junction solar cell shown in FIG. 9. Since the configurations illustrated in FIGS. 5 to 8 were described in detail above, a further description may be only briefly made or may be entirely omitted.

Hence, the efficiency of the thin film solar cell may be further improved.

Figure 10:
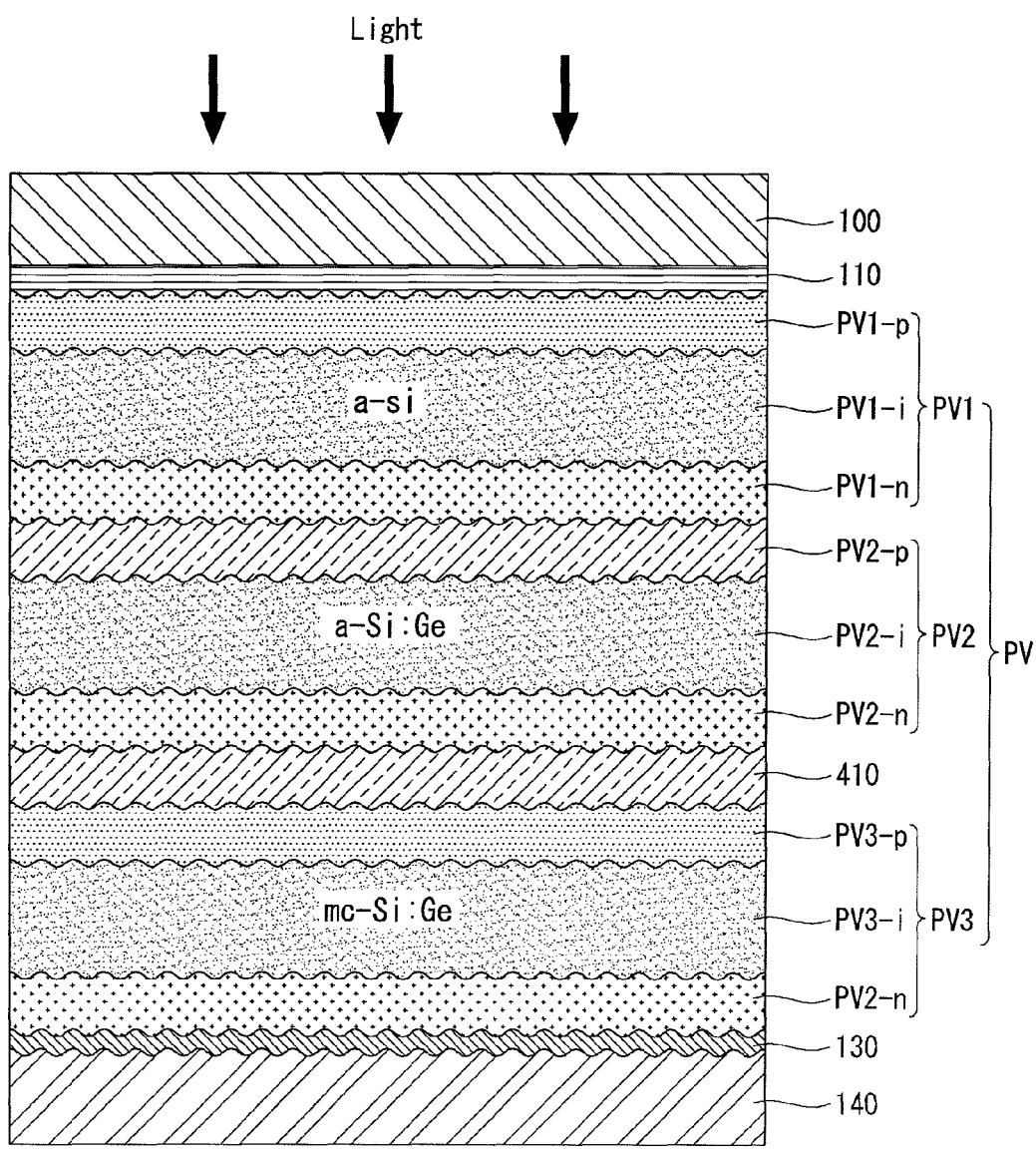
FIG. 10 illustrates an example where a solar cell according to an example embodiment of the invention includes a triple junction solar cell having a p-i-n/p-i-n/p-i-n structure.

FIG. 10 illustrates an example where the solar cell according to the embodiment of the invention includes a triple junction solar cell having a p-i-n/p-i-n/p-i-n structure.

Structures and components identical or equivalent to those described above are designated with the same reference numerals, and a further description may be only briefly made or may be entirely omitted.

As shown in FIG. 10, a photoelectric conversion unit PV of a thin film solar cell may include a first photoelectric conversion unit PV 1, a second photoelectric conversion unit PV2, and a third photoelectric conversion unit PV3 that are sequentially positioned on the incident surface of the substrate 100 in the order named. Other layers may be included or present in the first, second and/or third photoelectric conversion units or therebetween.

Each of the first photoelectric conversion unit PV1, the second photoelectric conversion unit PV2, and the third photoelectric conversion unit PV3 may have the p-i-n structure in the embodiment of the invention. Thus, a first p-type semiconductor layer PV1-*p*, a first i-type semiconductor layer PV1-*i*, a first n-type semiconductor layer PV1-*n*, a second p-type semiconductor layer PV2-*p*, a second i-type semiconductor layer PV2-*i*, a second n-type semiconductor layer PV2-*n*, a third p-type semiconductor layer PV3-*p*, a third i-type semiconductor layer PV3-*i*, and a third n-type semiconductor layer PV3-*p* may be sequentially positioned on the substrate 100 in the order named. Other layers may be included or present in the first, second, and/or third photoelectric conversion units or therebetween.

The first i-type semiconductor layer PV 1-*i*, the second i-type semiconductor layer PV2-*i*, and the third i-type semiconductor layer PV3-*i* may be variously implemented.

As a first example of the configuration illustrated in FIG. 10, the first i-type semiconductor layer PV1-*i* may contain amorphous silicon (a-Si), the second i-type semiconductor layer PV2-*i* may contain germanium (Ge)-containing amorphous silicon (a-SiGe), and the third i-type semiconductor layer PV3-*i* may contain germanium (Ge)-containing microcrystalline silicon (mc-SiGe).

Both the second i-type semiconductor layer PV2-*i* and the third i-type semiconductor layer PV3-*i* may be doped with germanium (Ge).

An amount of germanium (Ge) contained in the third i-type semiconductor layer PV3-*i* may be more than an amount of germanium (Ge) contained in the second i-type semiconductor layer PV2-*i*. This is because a band gap decreases as the amount of germanium (Ge) increases. The reduction in the band gap is advantageous to absorb light of the long wavelength band.

Accordingly, when the amount of germanium (Ge) contained in the third i-type semiconductor layer PV3-*i* is more than the amount of germanium (Ge) contained in the second i-type semiconductor layer PV2-*i*, the third i-type semiconductor layer PV3-*i* may efficiently absorb light of the long wavelength band.

As a second example of the configuration illustrated in FIG. 10, the first i-type semiconductor layer PV1-*i* may contain amorphous silicon (a-Si), and the second i-type semiconductor layer PV2-*i* and the third i-type semiconductor layer PV3-*i* may contain microcrystalline silicon (mc-Si). A band gap of the third i-type semiconductor layer PV3-*i* may be reduced by doping only the third i-type semiconductor layer PV3-*i* with Ge as impurities.

As shown in FIG. 10, the embodiment of the invention is described below based on the first example in which, the first i-type semiconductor layer PV1-*i* and the second i-type semiconductor layer PV2-*i* contain amorphous silicon (a-Si), the third i-type semiconductor layer PV3-*i* contains microcrystalline silicon (mc-Si), and the second i-type semiconductor, layer PV2-*i* and the third i-type semiconductor layer PV3-*i* contain germanium (Ge).

The first photoelectric conversion unit PV1 may absorb light of a short wavelength band, thereby producing electric power. The second photoelectric conversion unit PV2 may absorb light of a middle wavelength band between the short wavelength band and a long wavelength band, thereby producing electric power. The third photoelectric conversion unit PV3 may absorb light of the long wavelength band, thereby producing electric power.

A thickness of the third i-type semiconductor layer PV3-*i* may be greater than a thickness of the second i-type semiconductor layer PV2-*i*, and the thickness of the second i-type semiconductor layer PV2-*i* may be greater than a thickness of the first i-type semiconductor layer PV1-*i*.

For example, the thickness of the first i-type semiconductor layer PV1-*i* may be about 100 nm to 150 nm, the thickness of the second i-type semiconductor layer PV2-*i* may be about 150 nm to 300 nm, and the thickness of the third i-type semiconductor layer PV3-*i* may be about 1.5 µm to 4 µm.

The thicknesses are set so as to further increase an absorptance of the third i-type semiconductor layer PV3-*i* with respect to the light of the long wavelength band.

The triple junction solar cell shown in FIG. 10 may absorb light of the wider band, and thus, may further increase the production efficiency of electric power.

In the triple junction solar cell shown in FIG. 10, the carrier concentration in the top portion 110FP of each uneven portion of the front electrode 110 may be lower than the carrier concentration in the contact portion 110F1 between the substrate 100 and the front electrode 110 in the same manner as FIG. 1. All of the configurations illustrated in FIGS. 5 to 8 may be applied to the triple junction solar cell shown in FIG. 10. Since the configurations illustrated in FIGS. 5 to 8 were described in detail above, a further description may be only briefly made or may be entirely omitted.

Hence, the efficiency of the thin film solar cell may be further improved.

So far, the embodiment of the invention described the photoelectric conversion unit containing silicon. However, the embodiment of the invention may be applied to a photoelectric conversion unit containing materials other than silicon, for example, CdTe (cadmium telluride), CIGS (copper indium gallium selenide), or cadmium sulfide (CdS). Alternatively, the photoelectric conversion unit PV may contain a material, in which dye molecule, for example, cadmium sulfide (CdS) is adsorbed to porous titanium dioxide ($TiO_2$), and may contain an organic material or a polymer material.

Figure 11:
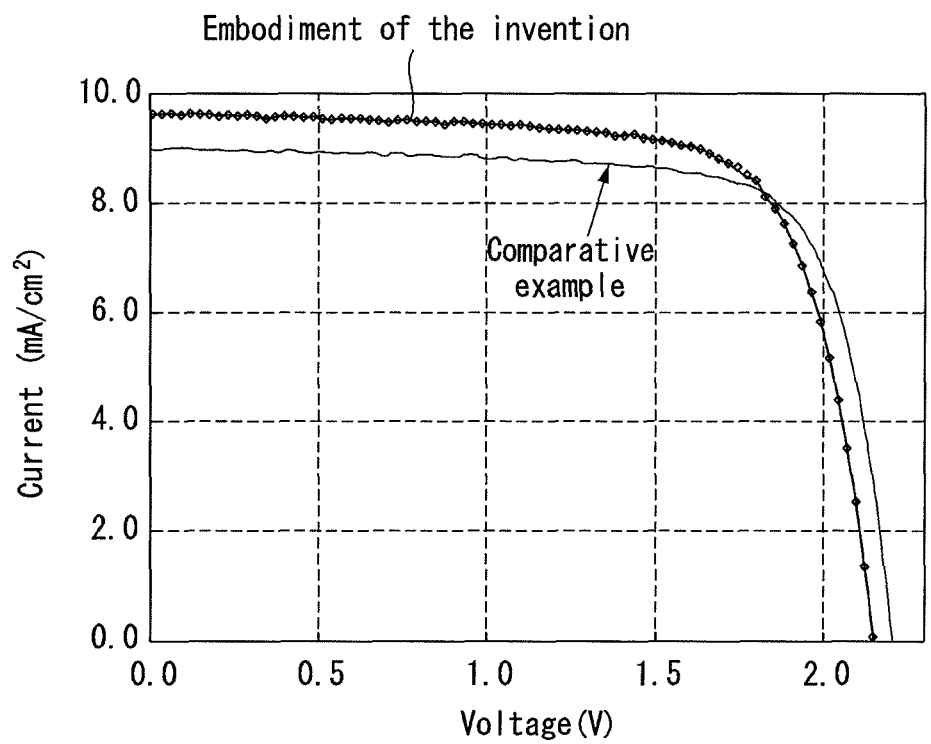
FIG. 11 illustrates an improved efficiency of a thin film solar cell according to an example embodiment of the invention.

FIG. 11 illustrates an improved efficiency of the thin film solar cell according to the embodiment of the invention.

In FIG. 11, (a) is a graph of voltage-current in each of the thin film solar cell according to the embodiment of the invention and a thin film solar cell according to a comparative example; and (b) is a table comparing efficiencies of the thin film solar cell according to the embodiment of the invention and the thin film solar cell according to the comparative example.

As shown in FIG. 11, in the thin film solar cell according to the embodiment of the invention, the voltage was relatively less reduced and the current relatively greatly increased, compared to the comparative example.

Hence, the efficiency of the thin film solar cell according to the embodiment of the invention was increased by about 0.15%.

The increase in the efficiency of the thin film solar cell is due to the carrier concentration in the top portion 110FP of each uneven portion of the front electrode 110 being lower than the carrier concentration in the contact portion 110F1 between the substrate 100 and the front electrode 110. Hence, a reduction in the transmittance of the front electrode 110 may be minimized. Further, the generation of pinholes in the front electrode 110 may be prevented or reduced, and the generation of crack in the photoelectric conversion unit PV formed on the front electrode 110 may be minimized.

A method for manufacturing the thin film solar cell according to the embodiment of the invention is described below.

The method for manufacturing the thin film solar cell according to the embodiment of the invention includes depositing the front electrode 110 on the substrate 100 in a chamber, etching the front electrode 110 deposited on the substrate 100 to form the uneven portions on the surface of the front electrode 110, forming the photoelectric conversion unit PV on the front electrode 110, and forming the back electrode on the photoelectric conversion unit PV.

Figure 12:
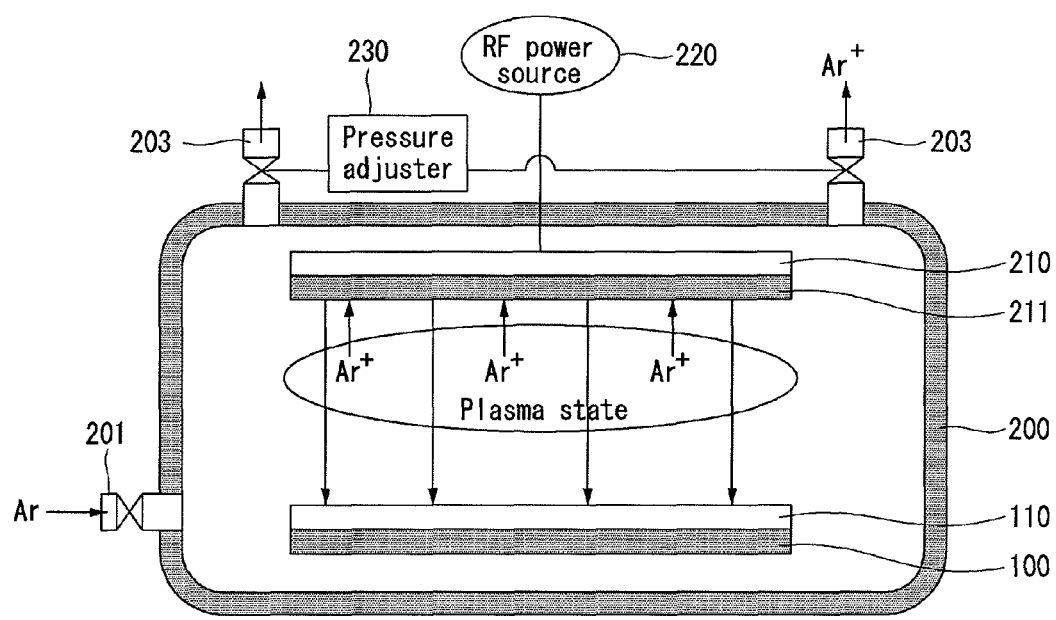
FIG. 12 illustrates a process for depositing a front electrode on a substrate when forming a thin film solar cell according to an example embodiment of the invention.

For example, when the front electrode 110 is formed on the substrate 100 using aluminum zinc oxide (ZnOx:Al), the front electrode 110 may be deposited through the sputtering method using a sputtering device shown in FIG. 12. Alternatively, when the front electrode 110 is formed on the substrate 100 using boron zinc oxide (ZnOx:B), the front electrode 110 may be formed using the CVD method.

A method for depositing the front electrode 110 using the sputtering method is described below.

Figure 13:
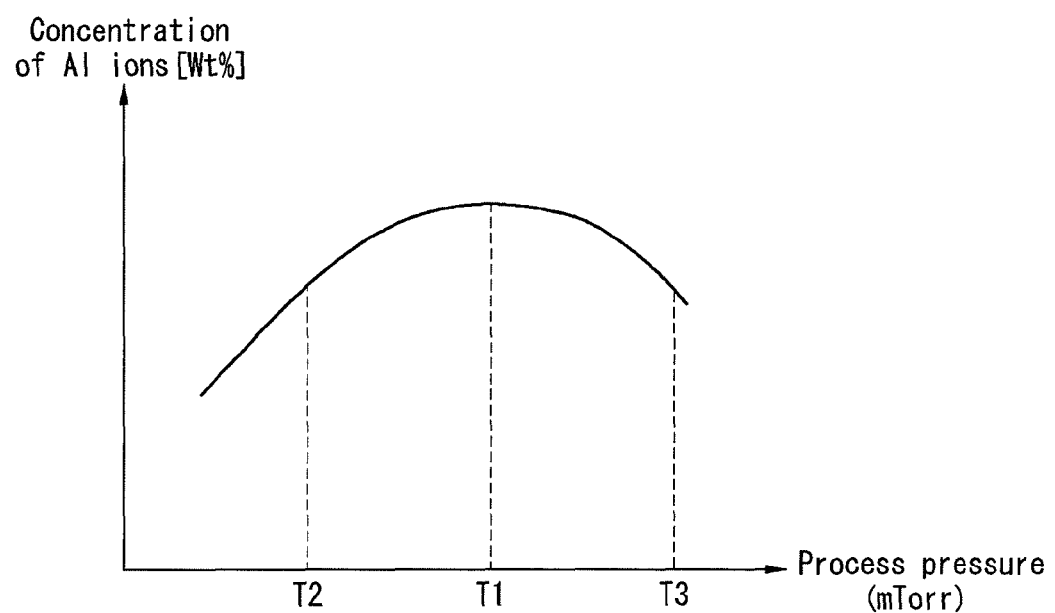
FIGS. 13 to 15 illustrate relationships between a sputtering process pressure when depositing a front electrode on a substrate and an aluminum concentration, a carrier concentration, compactness, and roughness of the front electrode.
Figure 14:
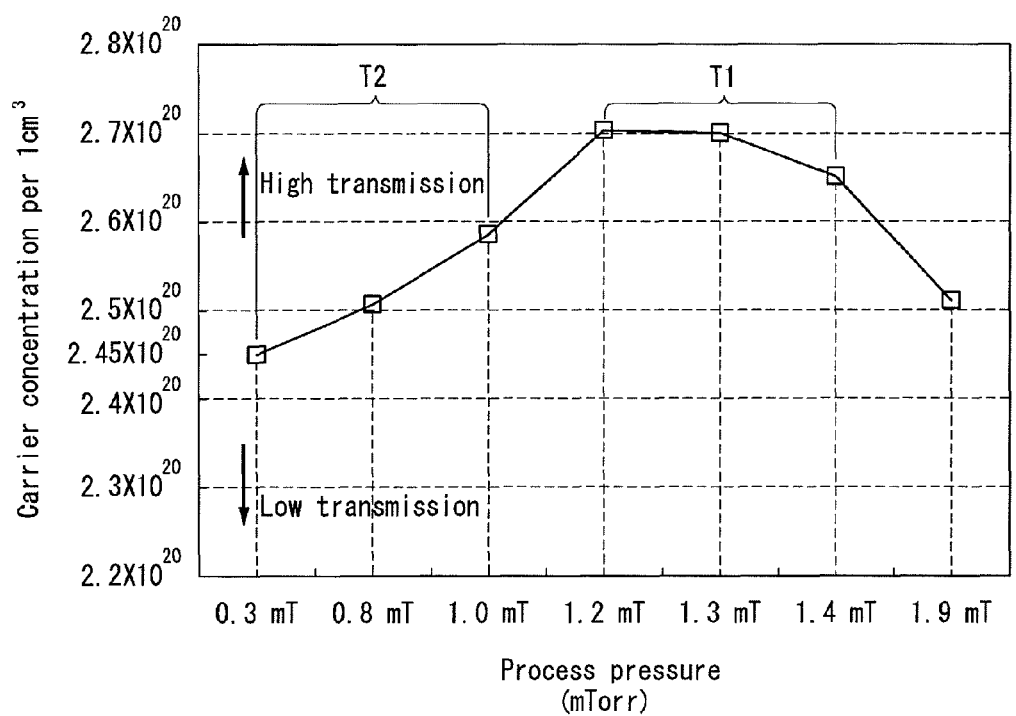
Figure 15:
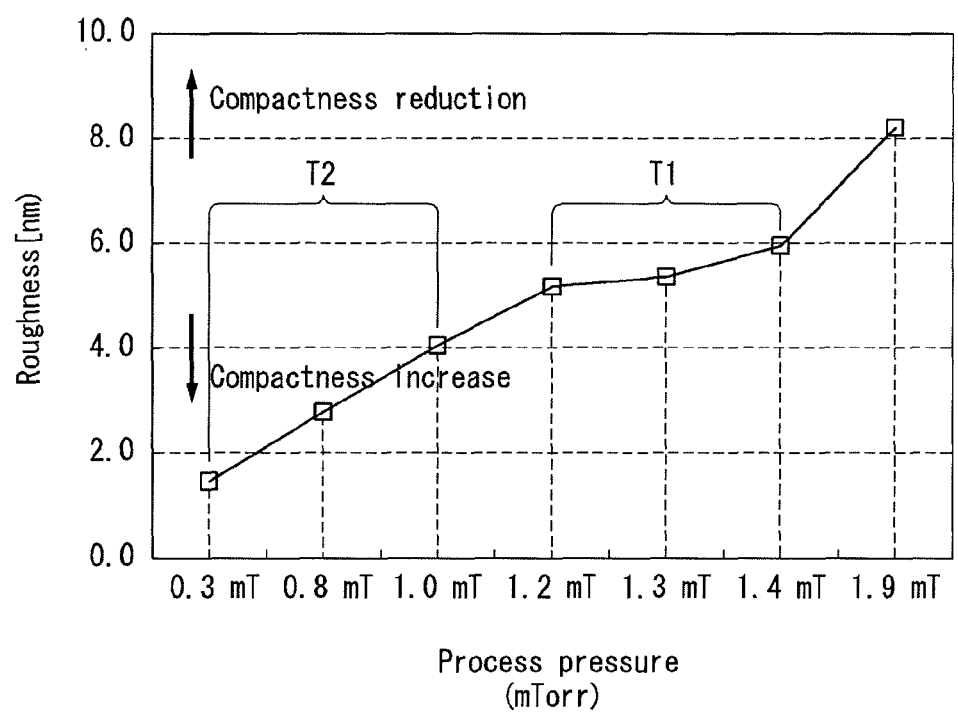

FIG. 12 illustrates a process for depositing the front electrode on the substrate when forming the thin film solar cell according to the embodiment of the invention. FIGS. 13 to 15 illustrate relationships between a sputtering process pressure when depositing the front electrode on the substrate and an aluminum concentration, a carrier concentration, compactness, and roughness of the front electrode.

As shown in FIG. 12, the substrate 100 is disposed inside a sputtering chamber 200 of the sputtering device. Then, aluminum zinc oxide (ZnOx:Al) may be deposited on the substrate 100 using the sputtering method to form the front electrode 110.

The sputtering device shown in FIG. 12 may include an inlet 201 into which a process gas is injected, an outlet 203 from which the process gas is discharged, a pressure adjuster 230 which adjusts a valve of the outlet 203 to adjust a pressure inside the sputtering chamber 200, a target material 211 used to deposit the front electrode 110 on the substrate 100, a sputtering electrode 210 which is disposed in the rear of the target material 211 and applies the voltage to the target material 211, and an RF power source 220 for applying an RF voltage to the sputtering electrode 210.

The target material 211 may contain aluminum zinc oxide (ZnOx:Al).

In the sputtering device shown in FIG. 12, when argon (Ar) gas as the process gas is injected into the inlet 201, argon (Ar) gas is changed into a plasma state in the chamber 200 and then is changed into a state of argon ions ($Ar^+$).

In this instance, a negative voltage is applied to the sputtering electrode 210, and thus, the argon ions ($Ar^+$) are drawn to the sputtering electrode 210 and then collide with the target material 211 containing aluminum zinc oxide (ZnOx:Al).

Hence, aluminum ions, zinc ions, and oxygen ions are discharged from the target material 211, and thus, are deposited on the substrate 100.

The pressure adjuster 230 may adjust the valve of the outlet 203 while the process gas is continuously injected into the inlet 201, thereby adjusting the process pressure inside the sputtering chamber 200.

The ratio of an amount of aluminum ions to an amount of zinc ions and oxygen ions discharged from the target material 211 is sensitively determined depending on the process pressure inside the sputtering chamber 200.

For example, when the process pressure of the sputtering chamber 200 is a relatively low value T2 in the sputtering process, the relative amount of aluminum ions decreases. On the other hand, when the process pressure of the sputtering chamber 200 is a relatively high value T1, the relative amount of aluminum ions has a maximum value. Further, when the process pressure of the sputtering chamber 200 is an excessively high value T3, the relative amount of aluminum ions decreases.

Even if the process pressure of the sputtering chamber 200 is the same, the maximum relative amount of aluminum ions may decrease or increase depending on a concentration of aluminum contained in the target material 211.

The carrier concentration of the front electrode 110 may be adjusted using aluminum zinc oxide (ZnOx:Al) and characteristics of the sputtering process.

More specifically, as shown in FIG. 14, when the process pressure of the sputtering chamber 200 is about 1.2 mTorr to 1.4 mTorr, the carrier concentration of the front electrode 110 deposited on the substrate 100 may be about $2.65 \times 10^{20}$ to $2.75 \times 10^{20}$ per unit volume ($cm^3$). Further, when the process pressure of the sputtering chamber 200 is about 0.3 mTorr to 1.0 mTorr, the carrier concentration of the front electrode 110 deposited on the substrate 100 may be about $2.45 \times 10^{20}$ to $2.6 \times 10^{20}$ per unit volume ($cm^3$).

The carrier characteristics of the front electrode 110 may be adjusted using a relationship between the process pressure and the carrier concentration in the sputtering process. As described above with reference to FIG. 2, the absorptance of the front electrode 110 may be improved using the carrier characteristics of the front electrode 110.

FIG. 15 illustrates the relationship between the sputtering process pressure and the compactness and the roughness of the front electrode 110 deposited on the substrate 100.

As shown in FIG. 15, the process pressure of the sputtering chamber 200 may be proportional to the roughness of the front electrode 110 after the uneven portions of the front electrode 110 are formed.

More specifically, when the process pressure increases from 0.3 mTorr to 1.9 mTorr, the roughness of the front electrode 110 may increase. As described above with reference to FIG. 3, because the roughness and the compactness of the front electrode 110 are inversely proportional to each other, the compactness of the front electrode 110 increases as the process pressure decreases, and vice versa.

Accordingly, when the process pressure increases from 0.3 mTorr to 1.9 mTorr, the compactness of the front electrode 110 decreases.

The front electrode 110 illustrated in FIG. 1 and FIGS. 5 to 8 may be formed by reducing the process pressure of the sputtering chamber 200 using the characteristic of the process pressure when the front electrode 110 is deposited on the substrate 100.

The process pressure for depositing the front electrode 110 illustrated in FIGS. 1 to 11 may be determined in consideration of the relationship between the sputtering process pressure and the carrier concentration and the aluminum concentration and the relationship between the sputtering process pressure and the roughness and the compactness of the front electrode 110.

The method for depositing the front electrode 110 while reducing the process pressure may be variously implemented.

Figure 16:
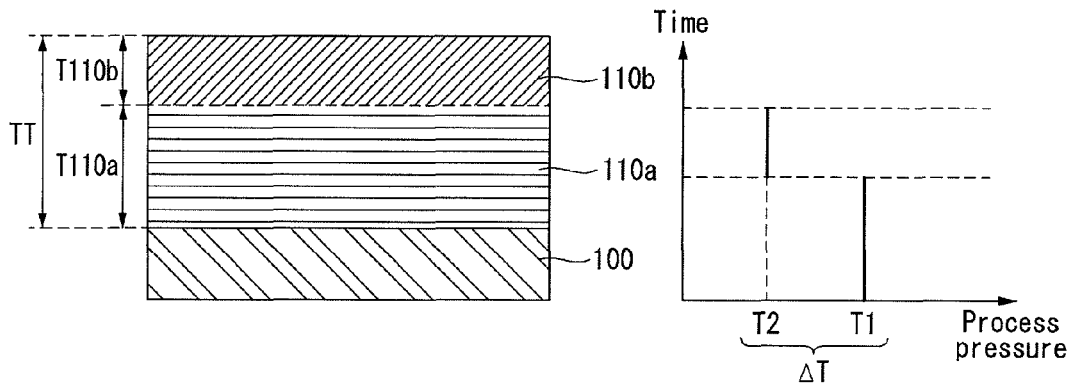
FIG. 16 illustrates various examples of adjusting a process pressure when a front electrode is deposited on a substrate while reducing the process pressure.
Figure 16:
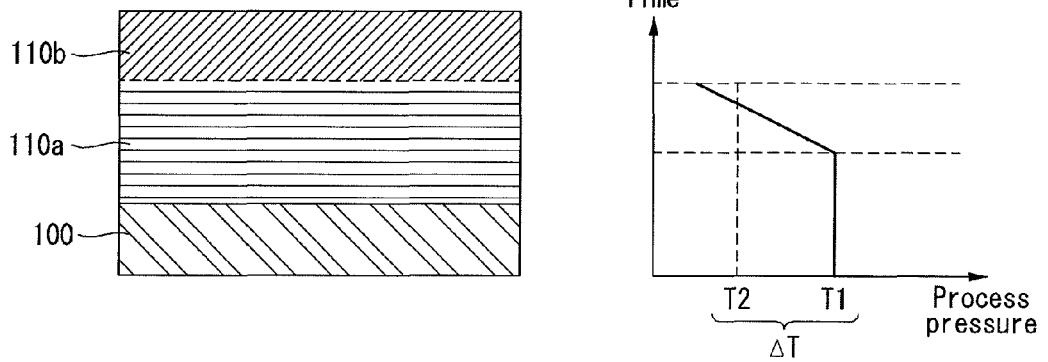
Figure 16:
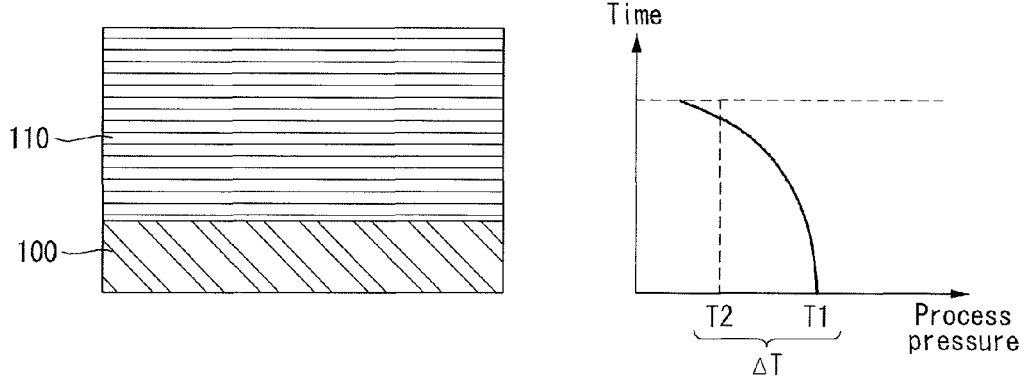

FIG. 16 illustrates various examples of adjusting the process pressure when the front electrode is deposited on the substrate while reducing the process pressure.

As shown in (a) of FIG. 16, the front electrode 110 may be deposited while the process pressure of the sputtering chamber 200 is discontinuously reduced from a first pressure T1 to a second pressure T2.

More specifically, the deposition of the front electrode 110 may include depositing the first front electrode layer 110a on the substrate 100 at the first pressure T1 and depositing the second front electrode layer 110b on the first front electrode layer 110a at the second pressure T2 lower than the first pressure T1.

In the embodiment of the invention, the first pressure T1 may be (or determined to) about 1.2 mTorr to 1.4 mTorr, and the second pressure T2 may be (or determined to) about 0.3 mTorr to 1.0 mTorr.

The above ranges of the first pressure T1 and the second pressure T2 are determined in consideration of the relationship between the sputtering process pressure and the carrier concentration and the aluminum concentration and the relationship between the sputtering process pressure and the roughness and the compactness of the front electrode 110 as described above with reference to FIGS. 13 to 15.

A deposition thickness T110b of the second front electrode layer 110b may be less than a deposition thickness T110a of the first front electrode layer 110a. For example, the first front electrode layer 110a may be about 1.1 to 2.5 times thicker than the second front electrode layer 110b.

Figure 17:
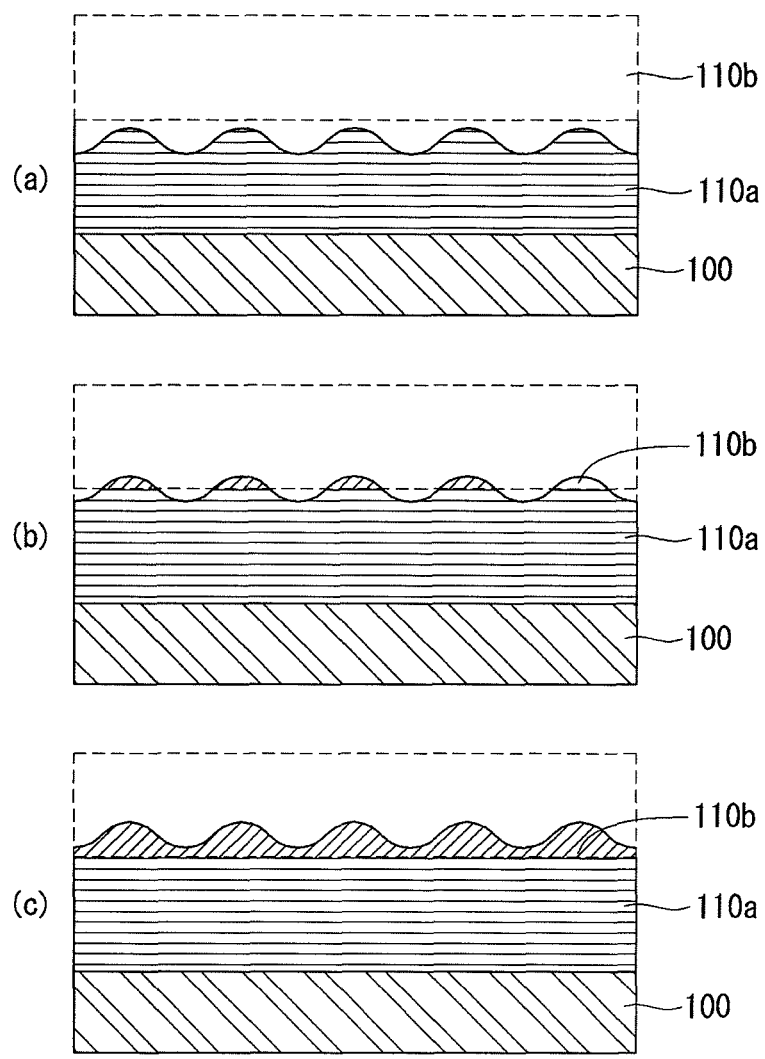
FIG. 17 relates to various methods for etching a front electrode deposited on a substrate to form uneven portions on the surface of the front electrode.

As described above, a reason why the deposition thickness T110b of the second front electrode layer 110b is less than the deposition thickness T110a of the first front electrode layer 110a is that a considerable portion of the second front electrode layer 110b may be removed in the process for forming the uneven portions on the surface of the front electrode 110 as shown in FIG. 17. Hence, the manufacturing cost may be reduced.

For example, the deposition thickness T110a of the first front electrode layer 110a may be about 0.5 µm to 1.0 µm, and the deposition thickness T110b of the second front electrode layer 110b may be about 0.3 µm to 0.6 µm. Further, a total thickness TT of the deposition thickness T110a of the first front electrode layer 110a and the deposition thickness T110b of the second front electrode layer 110b may be about 0.8 µm to 1.4 µm.

Each above numerical limitation about the deposition thicknesses T110a and T110b of the first and second front electrode layers 110a and 110b and the total thickness TT was determined in consideration of formation heights and etching time of a portion, which will be removed by the etching process after the front electrode 110 is deposited using the sputtering method, a remaining portion after the etching process, and the uneven portions. Hence, the manufacturing cost may be reduced.

As shown in (b) of FIG. 16, the front electrode 110 may be deposited while the process pressure of the sputtering chamber 200 is continuously reduced from the first pressure T1.

More specifically, when the first front electrode layer 110a is formed on the substrate 100, the first front electrode layer 110a may be deposited at the first pressure T1. When the second front electrode layer 110b is formed on the first front electrode layer 110a, the second front electrode layer 110b may be deposited while the process pressure of the sputtering chamber 200 is continuously reduced from the first pressure T1 to a pressure equal to or less than the second pressure T2 lower than the first pressure T1.

Accordingly, the second front electrode layer 110b, of which the carrier concentration or the aluminum concentration gradually decreases, may be deposited. Further, compactness of the second front electrode layer 110b may be greater than the compactness of the first front electrode layer 110a.

A reason why the final process pressure in the deposition of the second front electrode layer 110b is equal to or less than the second pressure T2 is that a considerable portion of the second front electrode layer 110b may be removed in the etching process. Hence, a carrier concentration of the remaining portion (in which the uneven portions are formed) by the etching process is adjusted to be substantially the same as the carrier concentration illustrated in FIG. 1 and FIGS. 5 to 8.

As shown in (c) of FIG. 16, when the front electrode 110 is formed on the substrate 100, the front electrode layer 110 may be deposited while the process pressure of the sputtering chamber 200 is nonlinearly and continuously reduced from the first pressure T1 to a pressure equal to or less than the second pressure T2 lower than the first pressure T1.

Alternatively, when the front electrode 110 is formed on the substrate 100, the front electrode layer 110 may be deposited while the process pressure of the sputtering chamber 200 is linearly and continuously reduced from the first pressure T1 to a pressure equal to or less than the second pressure T2 lower than the first pressure T1.

FIG. 17 illustrates various methods for etching the front electrode deposited on the substrate to form the uneven portions on the surface of the front electrode.

A wet etching method may be used to etch the front electrode 110. The etched depth in the total thickness TT of the front electrode 110 may be adjusted by adjusting etching time and a concentration of an etchant.

As shown in (a) of FIG. 17, when the first front electrode layer 110a and the second front electrode layer 110b of the front electrode 110 are deposited as described above with reference to (a) and (b) of FIG. 16, the second front electrode layer 110b may be entirely removed by etching the front electrode 110 in the process for forming the uneven portions on the surface of the front electrode 110.

In this instance, the carrier concentration of the front electrode 110 is held at a certain level. However, as shown in FIGS. 3 and 4, the roughness and the compactness of the second front electrode layer 110b are relatively high, and etching time of the first front electrode layer 110a relatively decreases.

Hence, the formation of pinholes in the first front electrode layer 110a resulting from the etching may be prevented or reduced, and the roughness of the first front electrode layer 110a may relatively decrease. As a result, even if the photoelectric conversion unit PV is deposited on the first front electrode layer 110a, the generation of crack in the photoelectric conversion unit PV may be prevented or reduced.

Unlike (a) of FIG. 17, as shown in (b) and (c) of FIG. 17, the front electrode 110 is etched in the process for forming the uneven portions on the surface of the front electrode 110, and thus, the top portions 110FP of the uneven portions may be the second front electrode layer 110b.

In other words, the front electrode 110 may be etched, so that the second front electrode layer 110b necessarily remains in the top portions 110FP of the uneven portions.

Hence, the thin film solar cell illustrated in FIGS. 6 to 8, in which a reduction in the transmittance of the front electrode 110 may be minimized and the pinholes and the crack may be prevented or reduced from being generated in the front electrode 110, may be manufactured.

Figure 18:
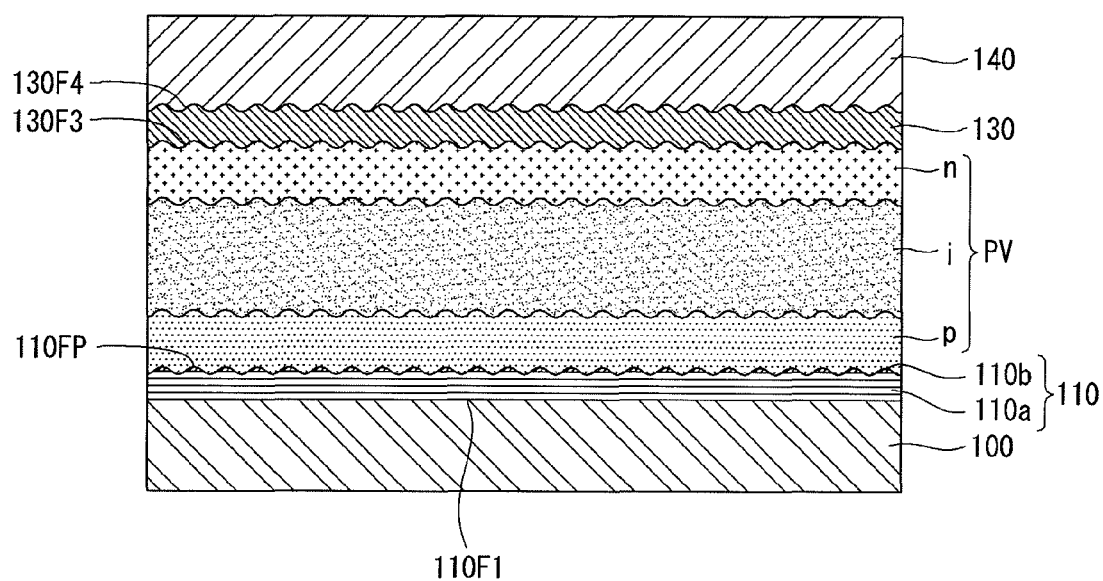
FIG. 18 relates to a method for forming a photoelectric conversion unit on a front electrode and forming a back electrode on the photoelectric conversion unit.

Next, as shown in FIG. 18, the photoelectric conversion unit PV is formed on the front electrode 110, and the back electrode 140 is formed on the photoelectric conversion unit PV. A contact portion 130F3 between the photoelectric conversion unit PV and the back reflection layer 130, and a contact portion 130F4 between the back reflection layer 130 and back electrode 140 are shown in FIG. 18. Hence, the thin film solar cell may be completed.

As described above, the method for manufacturing the thin film solar cell according to the embodiment of the invention improves the transmittance of the front electrode and prevents or reduces the generation of the pinholes and the crack in the front electrode, thereby further improving the efficiency of the thin film solar cell.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a thin film solar cell comprising:
   depositing a front electrode on a substrate in a chamber;
   etching the front electrode formed on the substrate to form an uneven portion on a surface of the front electrode;
   forming a photoelectric conversion unit on the front electrode; and
   forming a back electrode on the photoelectric conversion unit,
   wherein the depositing of the front electrode includes depositing the front electrode while reducing a process pressure of the chamber from a first pressure to a second pressure lower than the first pressure, and
   wherein the etching of the front electrode forms the uneven portion of the front electrode so that a top portion of the uneven portion includes a portion formed at the second pressure.

2. The method of claim 1, wherein the depositing of the front electrode includes:
   depositing a first front electrode layer on the substrate at the first pressure; and
   depositing a second front electrode layer on the first front electrode layer at the second pressure.

3. The method of claim 2, wherein a deposition thickness of the second front electrode layer is less than a deposition thickness of the first front electrode layer.

4. The method of claim 2, wherein the first front electrode layer is about 1.1 to 2.5 times thicker than the second front electrode layer.

5. The method of claim 2, wherein a formation thickness of the first front electrode layer is about 0.5 μm to 1.0 μm.

6. The method of claim 2, wherein a formation thickness of the second front electrode layer is about 0.3 μm to 0.6 μm.

7. The method of claim 2, wherein the etching of the front electrode forms the uneven portion of the front electrode so that the top portion of the uneven portion includes the second front electrode layer formed at the second pressure, and a valley portion of the uneven portion includes the first front electrode layer formed at the first pressure.

8. The method of claim 2, wherein the etching of the front electrode forms the uneven portion of the front electrode so that the top portion of the uneven portion and a valley portion of the uneven portion include the second front electrode layer formed at the second pressure.

9. The method of claim 2, wherein each of the first front electrode layer and the second front electrode layer of the front electrode contains aluminum zinc oxide ($ZnO_x$:Al) and is deposited.

10. The method of claim 9, wherein an aluminum concentration of the second front electrode layer is lower than an aluminum concentration of the first front electrode layer.

11. The method of claim 9, wherein a ratio of an aluminum concentration in a portion of the front electrode contacting the substrate to an aluminum concentration in the top portion of the uneven portion of the front electrode is about 1.05 to 1.2.

12. The method of claim 9, wherein an aluminum concentration in a portion of the front electrode contacting the substrate is about 0.48 wt % to 0.54 wt %, and
   wherein an aluminum concentration in the top portion of the uneven portion of the front electrode is about 0.42 wt % to 0.48 wt %.

13. The method of claim 2, wherein a carrier concentration of the second front electrode layer is lower than a carrier concentration of the first front electrode layer.

14. The method of claim 2, wherein a change in the carrier concentration of the second front electrode layer to the carrier concentration of the first front electrode layer is one of discontinuous and continuous.

15. The method of claim 1, wherein the first pressure is about 1.2 mTorr to 1.4 mTorr, and the second pressure is about 0.3 mTorr to 1.0 mTorr.

16. The method of claim 1, wherein the depositing of the front electrode includes:
   depositing a first front electrode layer on the substrate at the first pressure; and
   depositing a second front electrode layer on the first front electrode layer while continuously reducing the process pressure of the chamber from the first pressure to the second pressure lower.

17. The method of claim 1, wherein the front electrode is deposited using a sputtering method.

* * * * *